US006833306B2

(12) United States Patent
Lyding et al.

(10) Patent No.: US 6,833,306 B2
(45) Date of Patent: Dec. 21, 2004

(54) DEUTERIUM TREATMENT OF SEMICONDUCTOR DEVICE

(75) Inventors: Joseph W. Lyding, Champaign, IL (US); Karl Hess, Champaign, IL (US); Jinju Lee, Urbana, IL (US)

(73) Assignee: Board of Trustees of the University of Illinois, Urbana, IL (US)

( * ) Notice: Subject to any disclaimer, the term of this patent is extended or adjusted under 35 U.S.C. 154(b) by 252 days.

(21) Appl. No.: 10/202,187

(22) Filed: Jul. 24, 2002

(65) Prior Publication Data

US 2003/0219950 A1 Nov. 27, 2003

Related U.S. Application Data

(63) Continuation of application No. 09/850,920, filed on May 7, 2001, now abandoned, and a continuation-in-part of application No. 09/518,802, filed on Mar. 3, 2000, now Pat. No. 6,444,533, which is a division of application No. 09/020,565, filed on Jan. 16, 1998, now Pat. No. 6,147,014, which is a continuation of application No. PCT/US97/00629, filed on Jan. 16, 1997, which is a continuation-in-part of application No. 08/586,411, filed on Jan. 16, 1996, now Pat. No. 5,872,387.

(51) Int. Cl.[7] ............................................. H01L 21/336
(52) U.S. Cl. ....................... 438/301; 438/795; 438/909
(58) Field of Search ................................. 438/301, 303, 438/305, 307, 308, 795, 909

(56) References Cited

U.S. PATENT DOCUMENTS

| | | | |
|---|---|---|---|
| 3,849,204 A | 11/1974 | Fowler | 148/1.5 |
| 3,923,559 A | 12/1975 | Sinha | 148/1.5 |
| 4,113,514 A | 9/1978 | Pankove et al. | 148/1.5 |
| 4,151,007 A | 4/1979 | Levinstein et al. | 148/1.5 |
| 4,290,825 A | 9/1981 | Dearnaley et al. | 148/33.4 |
| 4,331,486 A | 5/1982 | Chenevas-Paule | 148/1.5 |
| 4,620,211 A | 10/1986 | Baliga et al. | 357/38 |
| 5,059,551 A | 10/1991 | ChevaLier et al. | 437/96 |
| 5,179,029 A | 1/1993 | Gottscho et al. | 437/10 |
| 5,248,348 A | 9/1993 | Miyachi et al. | 136/258 |
| 5,250,446 A | 10/1993 | Osawa et al. | 437/24 |
| 5,264,724 A | 11/1993 | Brown et al. | 257/347 |
| 5,504,020 A | 4/1996 | Aomori et al. | |
| 5,571,339 A | 11/1996 | Ringel et al. | 136/252 |
| 5,693,961 A | 12/1997 | Hamada | 257/66 |
| 5,872,387 A | 2/1999 | Lyding et al. | 257/607 |
| 5,972,765 A | 10/1999 | Clark et al. | 438/308 |
| 6,274,490 B1 | 8/2001 | Chyan et al. | 257/565 |

FOREIGN PATENT DOCUMENTS

WO WO 94/19829 9/1994 ........... H01L/29/40

OTHER PUBLICATIONS

Ph. Avouris, R.E. Walkup, A.R. Rossi, T.–C. Chen, G.C. Abeln, J.R. Tucker and J.W. Lyding, "STM–Induced H Atom Desorption From Si(100): Isotope Effects And Site Selectivity", *Chemical Physics Letters*, vol. 257, pp. 148–154 (Jul. 19, 1996).

G. Ganguly and A. Matsuda, "Light–Induced Detect Densities In Hydrogenated And Deuterated Amorphous Silicon Deposited At Different Substrate Temperatures", *Am Phys. Soc.*, vol. 49, No. 16, pp. 10 986–10 990.

I.P. Ipatova, O.P. Chikalova–Luzina and K. Hess, "Effect Of Localized Vibrations On The Si Surface Concentrations Of H And D", *J Appl Phys.*, vol. 83, No. 2, pp. 814–819 (Jan. 15, 1998).

(List continued on next page.)

*Primary Examiner*—Richard Booth

(57) ABSTRACT

Semiconductor device annealing process with deuterium at superatmospheric pressures to improve reduction of the effects of hot carrier stress during device operation, and devices produced thereby.

26 Claims, 3 Drawing Sheets

OTHER PUBLICATIONS

J.W. Lyding, T.-C. Shen, G.C. Abeln, C. Wang, E.T. Foley and J.R. Tucker, "Silicon Nanofabrication And Chemical Modification By UHV–STM", *Mat. Res. Soc. Symp. Proc.*, vol. 380, pp. 187–197 (1995).

J.C. Mikkelsen, Jr., "Secondary Ion Mass Spectrometry Characterizatin Of $D_{2O}$ and $H_2{}^{18}O$ Steam Oxidation Of Silicon", *J Electronic Mat.*, vol. 11, No. 3, pp. 541–558 (1982).

S.M. Myers and P.M. Richards, "Interactions Of Deuterium With Ion–Irradiated $SiO_2$ On Si", *J Appl Phys.*, vol. 67, No. 9, pp. 4064–4071 (May 1, 1990).

H. Park and C.R. Helms,. "The Effect Of Annealing Treatment On the Distribution Of Deuterium In Silicon And In Silicon/Silicon Oxide Systems", *J Electrochem. Soc.*, vol. 139, No. 7, pp. 2042–2046 (Jul. 1992).

N.S. Saks and R.W. Rendell, "The Time–Dependence Of Post–Irradiation Interface Trap Build–Up In Deuterium–Annealed Oxides", *IEEE Transactions On Nuclear Science*, vol. 39, No. 6, pp. 2220–2229 (Dec. 1 992).

N.S. Saks and R.W. Rendell, "Time–Dependence Of The Interface Trap Build–Up In Deuterium–Annealed Oxides After Irradiation", *Appl. Phys. Lett.*, vol. 61, No. 25, pp. 3014–3016 (Dec. 21, 1 992).

T.-C. Shen, C. Wang, G.C. Abeln, J.R. Tucker, J.W. Lyding, Ph. Avouris and R.E. Walkup, "Atomic–Scale Desorption Through Electronic And Vibrational Excitation Mechanisms", *Science*, vol. 268, pp. 1590–1592 (Jun. 16 ,1995).

J. M. Zavada, B.L. Weiss, I.V. Bradley, B. Theys, J. Chevallier, R. Rahbi, R. Addinall, R.C. Newman and H.A. Jenkinson, "Optical Waveguides Formed By Deuterium Passivation Of Acceptors In Si Doped p–Type GaAs Epilayers", *J Appl. Phys.*, vol. 71, No. 9, pp. 4151–4155 (May 1,1 992).

Kizilyalli et al., Deuterium Post–Metal Annealing of MOSFET's for Improved Hot Carrier Mobility:, IEEE Electron Device Letters, vol. 18, No. 3, Mar. 1997, pp. 81–83.

K. Creath and A Morales, "Contact and Noncontact Profilers", Chap. 17 in *Optical Shop Testing, 2nd Edition*, D. Malacara, Ed., pp. 700–703, John Wiley & Sons, New York (1992).

D. Malacara, "Twyman–Green Interferometer", chapter 2 in *Optical Shop Testing, 2nd Edition*, D. Malacara, Ed., pp. 51–94, John Wiley & Sons, New York (1992).

D. Malacara and S. L. DeVord, Interferogram Evaluation and Wavefront Fitting, Chap. 13 in *Optical Shop Testing, 2nd Edition*, D. Malacara, Ed., pp. 461–472, John Wiley & Sons, New York (1992).

J.W. Lyding, K. Hess and I.C. Kizilyalli, Reduction of Hot Electron Degradation in Metal Oxide Semiconductor Transistors by Deuterium Processing, Appl. Phys. Lett. 68, p. 2526 (1996).

J. Lee, J. Baker, R. Wilson and J.W. Lyding,"SIMS Depth Profiles of I H and 'H at the $SiO_2$/Si Interface of Deuterium–Sintered CMOS Devices", in SIMS XI Proc., 1997, pp. 205–208.

I.C. Kizilyalli, J. W. Lyding and K. Hess, "Deuterium Post–Metal Annealing of MOSFET's for Improved Hot Carrier Reliability", IEEE Electron Device Lett., vol. 18, p. 81, Mar. 1997.

Z. Chen et al., "On the Mechanism for Interface Trap Generation in MOS Transistors Due to Channel Hot Carrier Stressing", IEEE Electron Device Lett., vol. 21, pp. 24–26, Jan. 2000.

I.C. Kizilyalli et al., "Improvement of Hot Carrier Reliability with Deuterium Annals for Manufacturing Multilevel Metal/Dielectric MOS Systems", IEEE Electron Device Lett., vol. 19, pp. 444–446, Nov. 1999.

bkjnhJ. Lee et al., "SIMS Characterization of the Deuterium Sintering Process for Enhanced–Lifetime CMOS Transistors", J. Vac. Sci. Technol., vol. A16, p. 1762 (1998).

J. Lee, K. Cheng, K. Hess, J.W. Lyding, Y–K Kim, H–S Lee, Y–W Kim and K–P Suh, "Application of High Pressure Deuterium Annealing for Improving the Hot Carrier Reliability of CMOS Transistors", IEEE Elec. Dev. Lett., 21, p. 221 (2000).

DEUTERIUM TREATMENT OF SEMICONDUCTOR DEVICE

This application is a continuation of application No. 09/850,920 filed May 7, 2001 now abandoned which is a continuation-in-part of application 09/518,802 filed Mar. 3, 2000, now U.S. Pat. No. 6,444,533 which is a divisional of application 09/020,565 filed Jan. 16, 1998 (U.S. Pat. No. 6,147,014 which is a continuation of international application PCT/US97/00629 filed Jan. 16, 1997 which is a continuation-in-part of application 08/586,411 filed Jan. 16, 1996 (U.S. Pat. No. 5,872,387) all of which are hereby incorporated herein by reference as if each had been individually incorporated by reference and fully set forth herein.

This invention was made with Government support under Contract No. N00014-98-I-0604 awarded by Office of Naval Research. The Government has certain rights in the invention.

BACKGROUND OF THE INVENTION

This invention relates to treating semiconductor devices with deuterium to improve operating characteristics, and in particular to improve hot-carrier reliability of transistors, and to semiconductor devices resulting from such treatment.

Degradation of operating performance of semiconductor devices (for example CIMOS transistor device structures) due to hot carrier effects attributed to hydrogen desorption at an oxide (typically silicon oxide)/semiconductor(typically silicon) interface has been recognized and studied for many years. One proposed solution has been to subject such devices to hydrogen ($H_2$) annealing but in practice this has been recognized as ineffective. A more effective approach to alleviating the problem has been to include a deuterium annealing step at a convenient point in the device fabrication process manufacturing process, before or subsequent to contact formation and interconnects (metallization). Known deuterium annealing processes include, for example, those disclosed by U.S. Pat. No. 5, 872,387, in J. W. Lyding, K. Hess and I.C. Kizilyalli, "Reduction of Hot Electron Degradation in Metal Oxide Semicondutor Transistors by Deuterium Processing," Appl. Phys. Lett. 68, p. 2526 (1996), and in I. C. Kizilyalli, J. W. Lyding, and K. Hess, "Deuterium post-metal annealing of MOSFETs for improved hot carrier reliability," IEEE Electron Device Lett., vol 18, p. 81, March 1997, all of which, together with the publications to which subsequent reference is made herein, are hereby incorporated herein by reference as if each had been individually incorporated by reference and fully set forth herein.

While the beneficial impact of deuterium annealing on semiconductor device operating lifetime has been quite dramatic, and has improved, state of the art semiconductor devices remain prone to hot carrier problems and further improvements in processing to further alleviate this problem are desirable.

SUMMARY OF THE INVENTION

In one aspect, the present invention provides a process for manufacturing a semiconductor device including a semiconductor region and an insulating layer having an interface with the semiconductor region, comprising the steps of exposing the semiconductor device to an ambient including deuterium wherein said deuterium has a partial pressure in excess of atmospheric pressure to form a concentration of deuterium at the interface between said semiconductor region and said insulating layer. The deuterium annealing process may be carried out at any convenient point during the fabrication process but it is preferred to implement it after completion of all high temperature processing steps, i.e. typically after contact formation, to reduce deuterium dissipation which otherwise may occur. The invention has been found to result it, significant advantages in increasing lifetime of semiconductor devices subject to hot carrier stress during operation, as compared to hydrogen annealing and deuterium annealing at atmospheric pressure.

In another aspect, the present invention provides a process for manufacturing a semiconductor device including at least one insulating layer overlying a semiconductor region, comprising the steps of exposing said semiconductor device to an ambient including deuterium wherein said deuterium has a partial pressure in excess of atmospheric pressure. This aspect of the invention may be utilized to provide a high concentration of deuterium in interlevel dielectric layers used to insulate adjacent metal circuitry layers in semiconductor devices.

While a 100% deuterium ambient is preferred for the annealing process, other ambients may be used, for example a nitrogen/deuterium ambient, provided the deuterium partial pressure is above one atmospheric pressure. Thus, for example, a 50% deuterium 50% nitrogen ambient at 10 atmospheres may be used, resulting in a deuterium partial pressure of 5 atmospheres.

It is contemplated that deuterium pressures up to about 100 atmospheres may be technologically significant but for commercial purposes, pressures above about 15 atmospheres are less likely to be of interest. At deuterium pressures above about 10 atmospheres, additional interface defects may arise under some temperature conditions so that, for commercially practical purposes, deuterium pressures not exceeding about 10 atmospheres are regarded as preferable in practicing the invention. For any particular set of process parameters, the deuterium concentration resulting from the annealing process will increase with increasing deuterium pressure.

A process according to the invention may be carried out at temperatures of about 150° C. and above, typically up to about 600° C. and advantageously over the approximate range 350° C.–450° C. One advantage of the invention is that deuterium annealing carried out at deuterium pressures in excess of one atmosphere permit a reduction in processing temperature while resulting in equivalent benefits associated with deuterium annealing carried out at one atmosphere. For example, deuterium annealing at about 350° C. carried out in accordance with the invention has been found to produce similar benefits as deuterium processing at one atmosphere carried out in a temperature range of about 400° C. to 450° C.

A deuterium annealing process embodying the invention may typically be carried out over a period in excess of about 5 minutes, typically from about 10 minutes, preferably 30 minutes, to about 3 hours. The particular combination of deuterium superatmospheric pressure, annealing temperature and annealing time may be empirically determined and be affected, for example, by the particular device structure and the deuterium concentration desired at the target location. Increasing deuterium pressure permits a shorter annealing time to achieve a particular deuterium concentration at the target location. The deuterium concentration at the target location should be at least $10^{16}$ atoms/cc, desirably is in excess of about $10^{18}$ atoms/cc, and advantageously may be in the range $10^{19}$ to $10^{21}$ atoms/cc.

One problem related to carrying out post metal deuterium annealing is that current MOS technologies often employ silicon nitride sidewall spacers adjacent the gate insulator, and sometimes a barrier layer, such as a silicon nitride cap, is formed over the gate and other contacts, through which the deuterium has to penetrate. It has been found that an annealing process embodying the invention, using deuterium at superatmospheric pressure, is effective in improving deuterium penetration of such sidewall spacers and barrier layers. Consequently, the employment of a deuterium annealing process in accordance with the invention becomes more feasible as a final thermal process in semiconductor device fabrication which is advantageous in minimizing deuterium dissipation. Reference to a thermal process is intended to include any processing involving one or more cycles involving heating followed by cooling, e.g. deposition processing, which typically may occur at temperatures around 300° C. and upwards, in part dependent on the processing time involved.

The invention has particular application in processing CMOS structures in order to introduce a concentration of deuterium at the gate oxide/silicon interface, and advantageously is carried out after contact formation as the final thermal processing step. Suitably, the deuterium annealing process is carried out in a 100% deuterium ambient at a superatmospheric pressure up to about 6 atmospheres. Annealing temperatures in the approximate range 350° C. to 600° C. may conveniently be used but temperatures toward the lower end of this range, suitably 350° C., are preferred and annealing periods may typically range from about 30 minutes to about 3 hours. Deuterium processing of CMOS transistors in accordance with the invention has been found to be advantageous in facilitating incorporation of higher concentrations of deuterium at the gate silicon oxide/silicon interface, resulting in greater lifetime improvement in comparison to ambient (atmospheric pressure) deuterium annealing. It has been discovered that high pressure deuterium carried out in accordance with the invention also advantageously not only can increase the magnitude of the improvement but also can shorten the annealing time required to produce a given concentration of deuterium at the gate oxide/silicon interface.

As reported in J. Lee, K. Cheng, Z. Chen, K. Hess, J. W. Lyding, Y-K Kim, H-S Lee, Y-W kim and K-P suh, Application of High Pressure Deuterium Annealing for Improving the Hot carrier reliability of CMOS Transistors," IEEE Elec. Dev. Lett., 21, p. 221 (2000), the efficacy of annealing in a superatmospheric deuterium ambient has been demonstrated in fabrication of complementary metal-oxide-semiconductor (CMOS) transistors where it has been found that a greater than tenfold increase in device reliability lifetime can be achieved compared to deuterium processing at ambient pressure as reported in J. W. Lyding, Karl Hess, and I. C. Kizilyalli, "Reduction of Hot Electron Degradation in Metal Oxide Semiconductor Transistors by Deuterium Processing," Appl. Phys. Lett. 68, 2526 (1996). Furthermore, it is possible to significantly lower processing temperatures and still achieve a large lifetime improvement by processing at high deuterium pressure. This is particularly significant in view of the low thermal budgets of the latest CMOS technologies. High pressure deuterium processing in accordance with the invention appears likely to be beneficial for MOS technologies such as n-channel (NMOS) and p-channel (PMOS) devices, flash memory devices, the drive transistor and storage capacitor in dynamic random access memory (DRAM), static random access memory (SRAM) transistor, bipolar technologies, charge-coupled display (CCD) devices, biCMOS technology, silicon-germanium MOS devices, and compound semiconductor devices comprised of elements from columns III and V of the periodic table. High pressure deuterium embodying the invention may be used to incorporate high concentrations of deuterium in the interlayer dielectrics used to insulate adjacent metal circuitry layers in integrated circuits, e.g. microchips employing MOS, particularly CMOS, technology processing, as there is evidence that deuterium is beneficial in those locations. Solar cells based on crystalline silicon, polycrystalline silicon, and amorphous hydrogenated silicon are also known to benefit from deuterium incorporation and would therefore be improved by high pressure deuterium processing in accordance with the invention.

BRIEF DESCRIPTION OF THE DRAWINGS

By way of example, embodiments of the present invention will be described in greater detail with reference to the accompanying drawings, in which.

DETAILED DESCRIPTION OF THE INVENTION

The present invention may be practised using a p- or n-type substrate which may, for example, be doped or undoped crystalline silicon or amorphous silicon, gallium arsenide, or gallium aluminum arsenide. However, the following embodiments will be described with reference to use of a silicon substrate.

Figure 1:
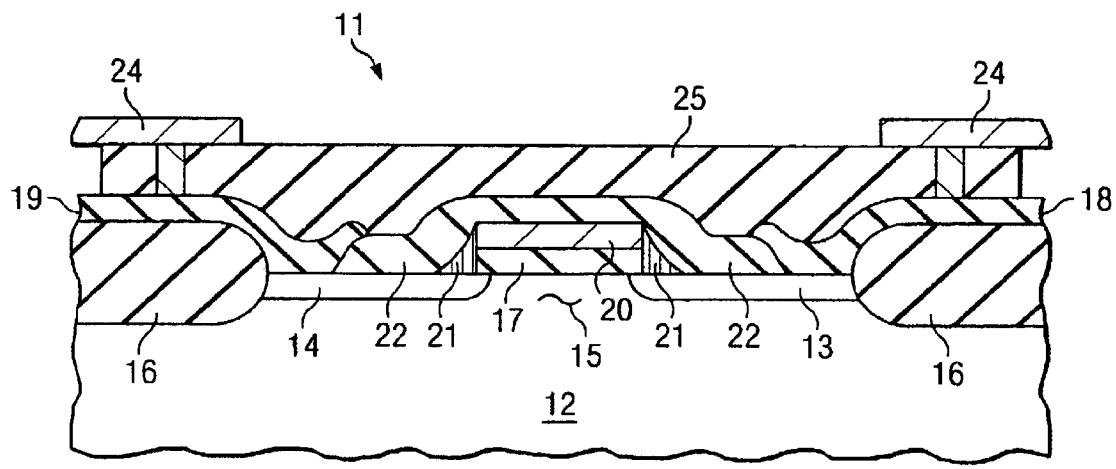
FIG. 1 depicts one illustrative metal oxide semiconductor field effect transistor device structure with respect to which a process according to the present invention will be described.

FIG. 1 is a diagram of an illustrative MOSFET, part of a CMOS structure, to which the present invention can be applied. The device 11 includes a silicon substrate 12 including at a surface of the substrate a drain 13, a source 14 and a channel 15 extending between them. A field oxide or other electrically insulative (dielectric) layer 16 is also provided adjacent the drain and source regions, as is a gate insulator (dielectric) 17 overlying the channel region and partly overlapping the drain and source regions. The drain and source regions 13 and 14 are n+ doped for an n-channel (p substrate) MOSFET device and p+ doped for a p-channel (n substrate) MOSFET device. Insulators 16 and 17 can be formed of a single layer or of multiple layers, and can include for instance an oxide and/or nitride of silicon (for convenience referred to as SiON), e.g. a silicon dioxide, silicon nitride, silicon oxy nitride, or silicon-rich oxide film. Insulating gate sidewall spacers 22 are formed adjacent the gate contact and an insulating barrier layer or cap 21 is formed over the gate contact 20. A SiON material, typically silicon nitride, may be used for the sidewall spacers 21 and cap 22. The device 11 also includes conductive contacts 18, 19 and 20 for the drain 13, source 14 and gate insulator 17, which can include one or more conductive materials such as metals, e.g. aluminum, gold, or copper; metal silicides such as tungsten, molybdenum, tantalum or titanium silicide, or combinations thereof; polysilicon; and titanium nitride. In an integrated circuit structure, the MOSFET device would be connected to other circuit components by one or more levels of interconnects separated by insulator layers; for example, first level interconnects 24 on insulator layer 25 are shown from the drain and source contacts 18, 19 in FIG. 1. The illustrated device is typical of a MOSFET employing a polysilicon gate contact with sidewall spacers and an overlying barrier layer or cap. Alternatively, the sidewall spacers 22 and/or the cap 21 could be formed as disclosed in U.S. Pat. No. 6,147,014. The general fabrication techniques for semiconductor devices of involved in carrying out the invention can be conventional, including conventional growth or deposition and of various semiconductor, insulating and conductive layers and doping operations employing appropriate masks.

In accordance with the invention, the semiconductor device is annealed in deuterium at superatmospheric pressure at a convenient point during fabrication but preferably after the drain, source and gate contacts 19, 18 and 20, the barrier cap 21, and interconnect metallization have been completed, and advantageously is carried out as the final thermal processing step. This annealing process results in a concentration of deuterium in the gate insulator layer and particularly at the gate insulator/channel interface and a significant increase in the level of reduction of hot carrier stress effects during operation of the device, thereby further increasing the lifetime of the device as compared, with known hydrogen annealing or deuterium annealing at normal atmospheric pressure.

In preferred embodiments of the invention, used in processing an MOSFET device as depicted in FIG. 1, the deuterium annealing process is typically carried out at superatmospheric pressures from about 2 atmospheres up to about 6 atmospheres at a temperature of about 450° C. However, the superatmospheric pressure annealing process may be carried out a lower temperatures, for example from about 150° C. upwards and it has been discovered that a superatmospheric annealing process in accordance with the invention at 350° C. can yield performance improvements equivalent to those obtained in a carrying out a deuterium annealing process at atmospheric pressure at a temperature of 450° C. using otherwise identical process parameters. Time periods for the annealing process are dependent on several factors, including the desired deuterium concentration at the semiconductor(silicon)/gate oxide(silicon dioxide) interface between the semiconductor (silicon) channel 15 and the gate insulator (silicon dioxide) 17, the anneal temperature and the superatmospheric pressure. Generally, increasing deuterium pressure requires a shorter anneal time at a given temperature. Preferably, the deuterium concentration at the channel/gate oxide interface is at least $10^{18}$ atoms/cc and advantageously may be in the range $10^{18}$ to $10^{21}$ atoms/cc. A superatmospheric pressure annealing process embodying the invention is preferably carried out in a 100% deuterium ambient; diluting the deuterium would decrease the effective deuterium pressure. However, the deuterium may be mixed with another gas (e.g. nitrogen) provided that in the mixture, the partial pressure of deuterium is above atmospheric pressure and equivalent to the desired deuterium pressure. The superatmospheric pressure deuterium annealing process may be carried out in a closed (static) pressurized deuterium environment but preferably the deuterium (or deuterium gas mixture) may be flowed through the reaction vessel at a suitable rate, e.g. on an industrial process level at about 100 to 200 litres/hour. The reaction vessel itself would need to be suitably thick walled and designed and fabricated to provide effective gas confinement under the applicable superatmospheric operating conditions.

The conditioning of the semiconductor device with deuterium has been found to significantly reduce effects associated with depassivation of the device by hot-carrier (e.g. hot-electron) effects. For example, as reported in the Experimental below, dramatic increases in device lifetime are observed when deuterium is used to passivate the devices, as compared to hydrogen annealing at atmospheric pressure (see FIGS. 2 and 3, respectively). These increases represent practical lifetime improvements by factors of about 80 to 90, and also make possible the operation of the semiconductor devices at higher voltages while better resisting aging due to hot electron effects.

The invention also can be beneficially practised to form a concentration of deuterium in an interlevel insulator between multilevel conductors providing connections between devices in an integrated circuit, e.g. in an interlevel insulator 25 on which are formed connections 24 from the source, drain and gate contacts of the MOS transistor depicted in FIG. 1 to other component devices(not shown) of the integrated circuit.

EXPERIMENTAL

The devices used in the following examples were fabricated using currently available 0.35 um 3.3 V CMOS technology ($t_{ox}$=5.5 nm). The wafers were fully processed with four levels of metallization, nitride sidewall spacers, and SiON capping layers, prior to annealing in accordance with embodiments of the present invention. The wafers were subjected to 100% D sintering at 450° C. at several pressures (2 and 6 atm). The annealing times varied from 10 min to 3 h. One control sample was processed using a conventional hydrogen forming gas anneal ($H_2$:$N_2$=10:90) at 400° C. for 30 min. As previously observed, there was no change in the pre-stress electrical characteristics for devices sintered in deuterium.

Five devices of a specific annealing condition were subjected to dc stresses with $V_{ds}$=3.5, 3.6, 3.7, 3.8, 3.9, 4.1, and 4.2V and $V_{gs}$ set to give the maximum substrate current ($I_{b,max}$) Transconductance ($G_m$), threshold voltage ($V_{th}$), and saturation current ($I_{d,sat}$) were monitored at various times during the entire stress. Lifetimes for each processing condition were then extracted from the stressed times showing 100-mV shift in $V_{th}$ and 10% degradation in $G_m$ and $I_{d,sat}$.

Deuterium incorporation as a function of pressure was measured by taking secondary ion mass spectrometry (SIMS) depth profiles on separate test wafers having 6000 A $SiO_2$ on top of Si. D incorporation at the interface was characterized by applying a 14.5 keV $Cs^+$ primary ion beam with negative secondary ion detection in a CAMECA ims-5f system. The secondary ion counts were converted to concentrations by calculating the relative sensitivity factors using calibration standards—see J. Lee J. Baker, R. Wilson, and J. W. Lyding, "SIMS depth profiles of I H and 'H at the $SiO_2$/Si interface of deuterium-sintered CMOS devices," in SIMS XI Proc., 1997, pp. 205–208.

RESULTS

Figure 3:
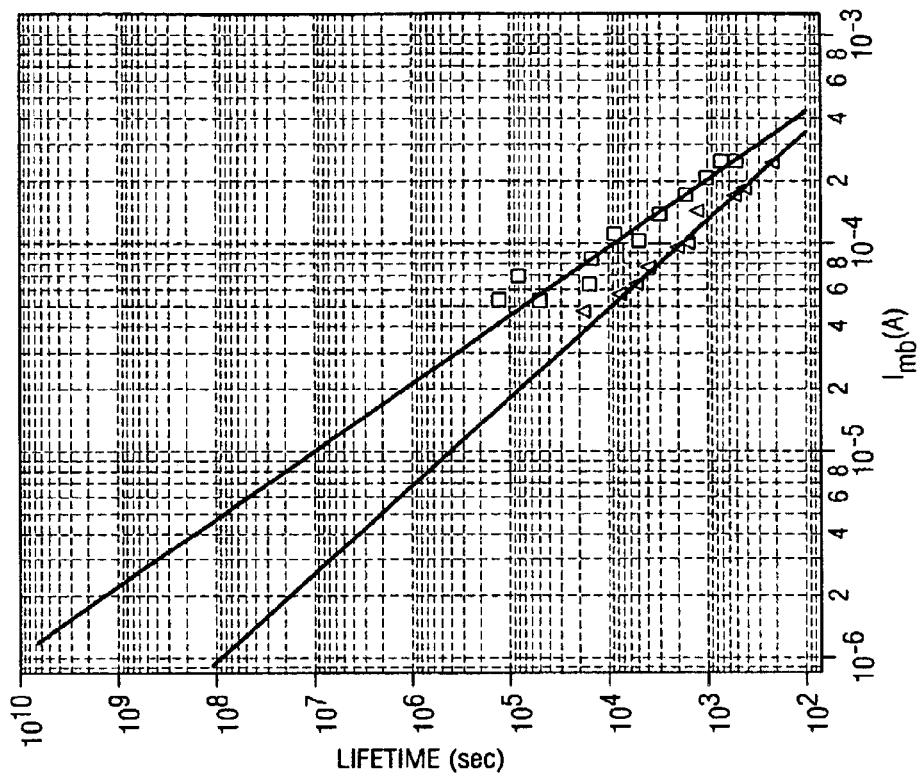
FIG. 3 is a log-log graph plotting device lifetime versus substrate current for devices annealed by a process according to an embodiment of the invention and for a comparable device subjected to hydrogen annealing.
Figure 2:
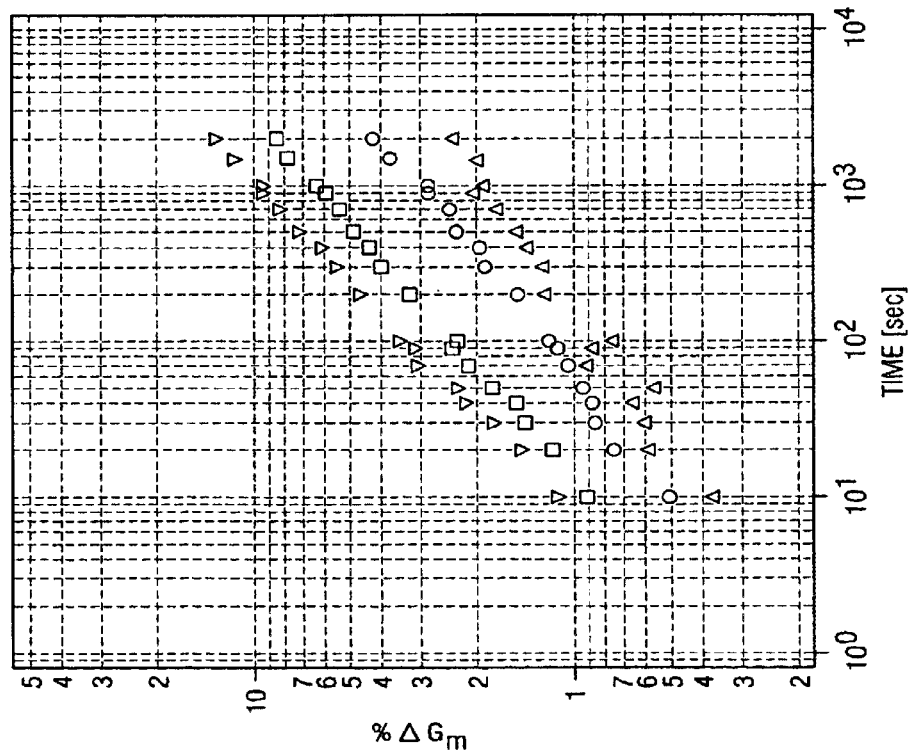
FIG. 2 is a graph showing percentage change in transconductance versus time under different biasing conditions (drain voltage $V_d$) of a MOSFET device annealed by a process embodying the invention.

During the hot carrier stress, the changes in $G_m$, $V_{th}$, and $I_{d,sat}$ were measured and recorded for numerous biasing conditions. FIG. 2 shows an example of the percentage change in Gm with four different biasing conditions for CMOS devices that were sintered at 6 atm for 3 h at 450° C. From this data, a log(lifetime) versus log(substrate current) graph can be plotted; the lifetime at a specific substrate current is extracted by a least squares fit to the measured data. FIG. 3 shows such a graph for devices that were sintered at 6 atm for 3 h and for devices sintered in conventional hydrogen forming gas. The graph clearly shows the lifetime improvement due to the D annealing. The conventional hydrogen anneal does not improve reliability lifetime. In fact, it has been observed by many experiments using wafers from several different manufacturers that annealing in 100% hydrogen at temperatures up to 480° C. for several hours at high pressures has no discernible effect on reliability lifetime. The lifetime improvements as described above, therefore, can be attributed solely to the presence of deuterium. The larger slope for the D data in FIG. 3 is consistent with earlier observations when there is a large isotope effect, see I. C. Kizilyalli, J. W. Lyding, and K. Hess, "Deuterium post-metal annealing of MOSFET's for improved hot carrier reliability," IEEE Electron Device Lett., vol. 18, p. 81, March 1997. It has also recently been found that the large isotope effect is only observed for interface state generation by channel hot electrons, and not by carriers injected into the oxide—see Z. Chen et al, "On the mechanism for interface trap generation in MOS transistors due to channel hot carrier stressing," IEEE Electron Device Lett., vol. 21 pp. 24–26, January 2000.

Figure 4:
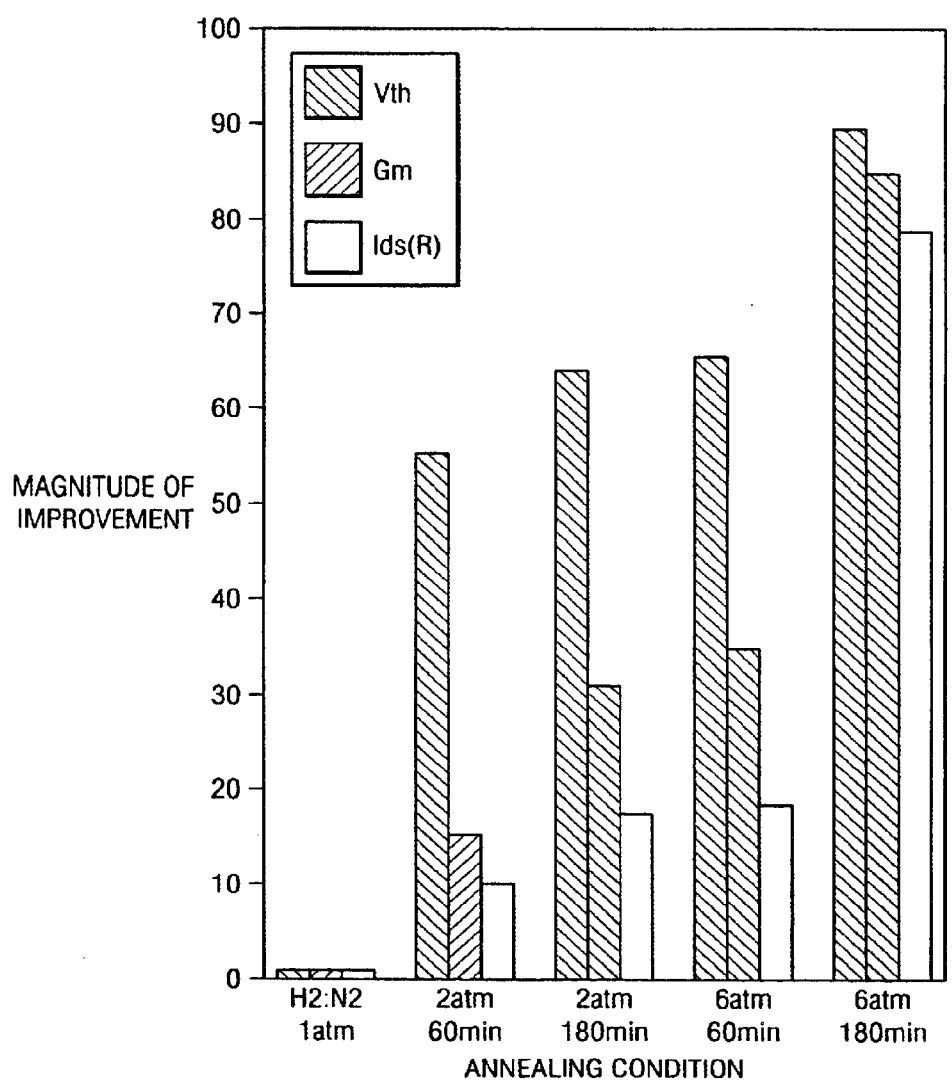
FIG. 4 depicts extrapolated lifetime improvements associated with MOSFETS annealed under different annealing conditions in accordance with the invention.

FIG. 4 shows the extrapolated lifetime improvements found for each annealing condition at the specific operating substrate current of 2 µA, derived from the $G_m$, $V_{th}$, and $I_{d,sat}$ measurements. The lifetimes were extracted from more than 15 data points for each condition in a log(lifetime) vs. log(substrate current) graph. Among the annealing conditions, 450° C. at 6 atm for 3 h exhibited the maximum improvement. With higher pressure processing, shorter annealing times can achieve the same magnitude of improvement. This is evident by comparing the data from the device annealed at 2 atm for 3 h with the one annealed at 6 atm for 1 h. In both cases, the lifetime improvements were nearly the same. With the higher pressure, the processing time was shortened by a factor of three. It is also interesting to note that the maximum lifetime improvement from deuterium annealing above atmospheric pressure in accordance with embodiments of the invention as described in this Experimental, is slightly higher than what was found in a previous study reported in I. C. Kizilyalli et al., "Improvement of hot carrier reliability with deuterium anneals for manufacturing multilevel metal/dielectric MOS systems," IEEE Electron Device Lett., vol. 19, pp. 444–446, November 1999. In that previous study, the devices had oxide sidewall spacers and were annealed at 1 atm for 5 h to achieve 80× improvement. With high pressure annealing, embodying the present invention, a shorter annealing time was required to achieve the same result from devices with substantially greater diffusion barriers imposed by the sidewall spacers and caps. Longer annealing time at a specific deuterium pressure gives better lifetime improvement. These factors highlight the correlation between D incorporation at the gate silicon oxide/silicon interface and lifetime improvement—see J. Lee et al. "SIMS characterization of the deuterium sintering process for enhanced-lifetime CMOS transistors," J. Vac. Sci. Technol., vol. A16, p. 1762, 1998.

Figure 5:
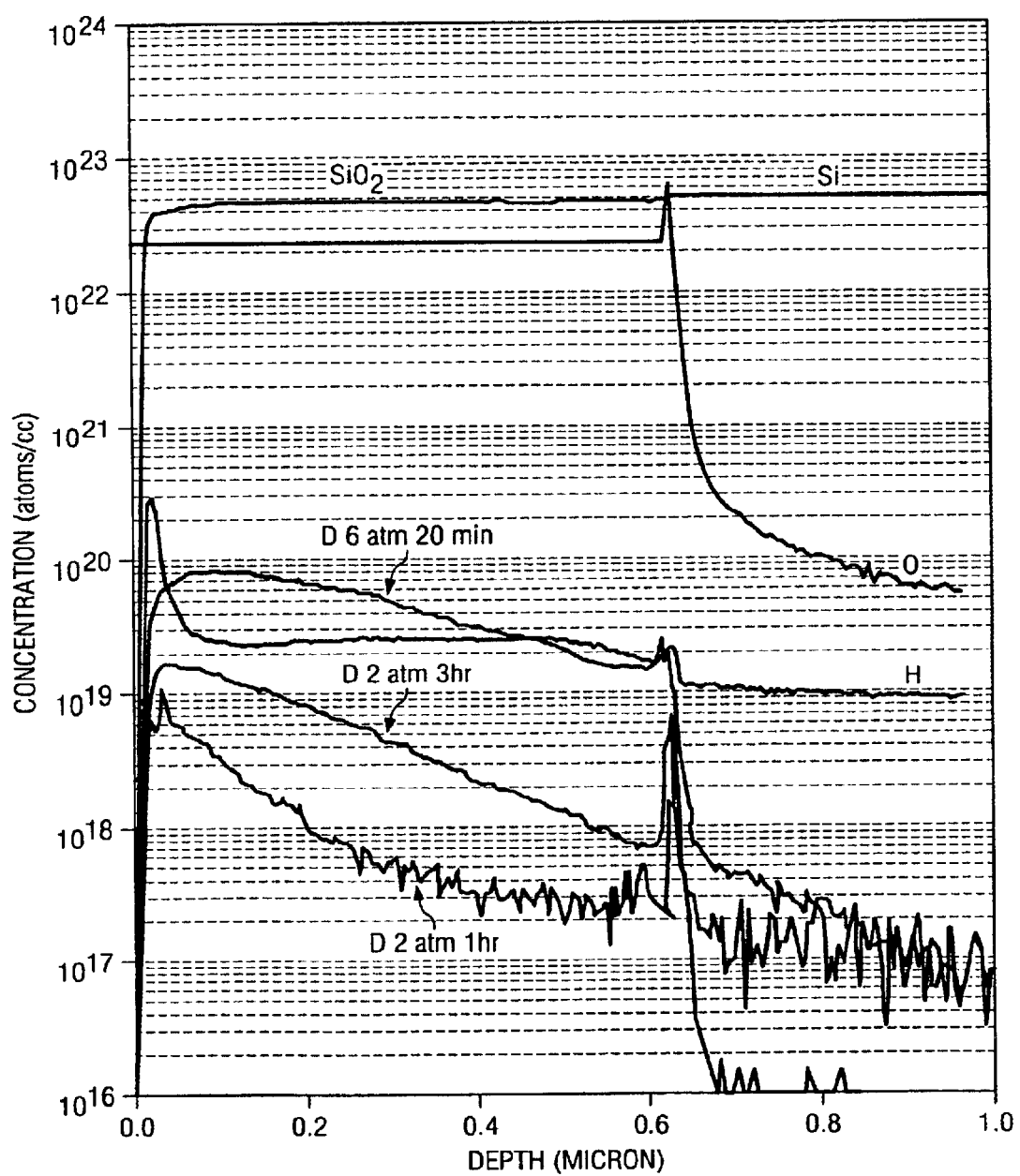
FIG. 5 depicts SIMS plots showing deuterium concentration across the gate oxide layer and channel of a MOSFET device annealed in accordance with the invention using different annealing parameters.

To confirm that the measured lifetime improvements correlate directly with deuterium incorporation, SIMS depth profiles of hydrogen and deuterium were obtained. FIG. 5 shows SIMS profiles comparing the deuterium incorporation for sintering at 2 atm for 1 and 3 h and at 6 atm for 20 min. The profiles clearly show that for both pressures, deuterium is incorporated at the $SiO_2/Si$ interface and that pressure increases the D incorporation at the interface and throughout the $SiO_2$ layer. Note that there is more D incorporation for the 20 min anneal at 6 atm than for the 3 hour anneal at 2 atm. Since the H profiles in all three samples were almost identical, only one profile is shown for clarity.

The beneficial effects of high pressure deuterium annealing on hot carrier reliability improvements of CMOS transistors has been disclosed. High pressure deuterium annealing has been shown to increase the rate of deuterium incorporation at the $SiO_2/ISi$ (gate oxide/channel) interface. A significant lifetime improvement (~90×) can be achieved from fully processed wafers (four metal layers) with nitride sidewall spacers and SiON cap layers, subjected to the novel deuterium annealing process. The improvement was determined by comparing to wafers that were annealed in a conventional hydrogen forming gas anneal. The annealing time to achieve the same level of improvement can also be significantly reduced. The increased incorporation of D at high pressure was confirmed by the secondary ion mass spectrometry characterization. The above description of embodiments of the invention has demonstrated the effectiveness of high pressure deuterium annealing at increasing the D incorporation rate. Even when applied to the devices with severe diffusion barriers to D, high pressure annealing improves hot carrier reliability with much shorter annealing times.

What is claimed is:

1. A process for treating a semiconductor device including a semiconductor region and an insulating layer having an interface with the semiconductor region, comprising the steps of annealing said semiconductor device during manufacture thereof, in an ambient including deuterium wherein said deuterium has a partial pressure in excess of atmospheric pressure, to form a concentration of deuterium at the interface between said semiconductor region and said insulating layer region effective to substantially reduce degradation of said device associated with hot carrier stress.

2. A process according to claim 1, wherein said deuterium partial pressure is between about 2 atmospheres and 15 atmospheres and the annealing is carried out at a temperature between about 150° C. and 600° C.

3. A process according to claim 2, wherein the annealing process is carried out for a period in excess of 5 minutes.

4. A process according to claim 3, wherein the annealing period is between 30 minutes and 3 hours.

5. A process for treating a semiconductor device including a semiconductor region and an insulating layer having an interface with the semiconductor region, comprising the steps of exposing said semiconductor device during manufacture thereof to an ambient including deuterium wherein said deuterium has a partial pressure between about 2 atmospheres to about 15 atmospheres, at a temperature above about 150° C. to form a concentration of deuterium greater than $10^{16}$ atoms/cc at the interface between said semiconductor region and said insulating layer.

6. A process for treating a semiconductor device including a semiconductor region and an insulating layer having an interface with the semiconductor region, comprising the steps of annealing said semiconductor device during manufacture thereof in an ambient including deuterium wherein said deuterium has a partial pressure in excess of atmospheric pressure up to about 10 atmospheres, at a temperature above about 350° C. to form a concentration of deuterium at the interface between said semiconductor region and said insulating layer.

7. A process according to claim 6, wherein said deuterium partial pressure is between about 2 atmospheres and about 6 atmospheres.

8. A process according to claim 6, wherein said temperature is in the approximate range 350° C. to 450° C.

9. A process according to claim 6, wherein said annealing is for a period of about 1–3 hours.

10. A process according to claim 6, wherein said annealing treatment is the final thermal processing step in the manufacturing process for the device.

11. A process for treating a semiconductor device including at least one insulating layer overlying a semiconductor region, comprising the steps of exposing said semiconductor device during manufacture thereof to an ambient including deuterium wherein said deuterium has a partial pressure in excess of atmospheric pressure, at a temperature above about 300° C. to form a concentration of deuterium in the insulating layer of at least $10^{18}$ atoms/cc.

12. A process for treating an insulated gate field effect transistor device during manufacture thereof to form a concentration of deuterium at an interface between a gate insulator and a channel region of said device, comprising annealing the device in a superatmospheric pressure deuterium ambient at a temperature in the range 300° C. to 600° C. for a time sufficient to provide a deuterium concentration of at least $10^{18}$ atoms/cc at said interface.

13. A process according to claim 12, wherein said deuterium partial pressure is between about 2 atmospheres and about 6 atmospheres.

14. A process according to claim 12, wherein said temperature is in the approximate range 350° C. to 450° C.

15. A process according to claim 12, wherein said annealing is for a period of about 1–3 hours.

16. A process according to claim 12, wherein said annealing treatment is the final thermal processing step in the manufacturing process for the device.

17. A process according to claim 12, wherein said annealing treatment is carried out subsequent to contact formation and interconnect metallization.

18. A process according to claim 12, wherein said deuterium concentration is in the range $10^{18}$ to $10^{21}$ atoms/cc.

19. A process for treating an insulated gate field effect transistor device including a channel region extending between source and drain regions, an insulating layer forming an interface with said channel region, and contacts to said source and drain regions and on said gate insulator layer, comprising, subsequent to formation of said source, drain and gate contacts, annealing the device in an ambient including deuterium at a partial pressure between about 2 and 10 atmospheres, at a temperature between about 300° C. and 600° C. for a period between about 30 minutes and three hours, to form a concentration of deuterium at said interface region.

20. A process for treating an insulated gate field effect transistor device including a channel region extending between source and drain regions, an insulating layer forming an interface with said channel region, and contacts to said source and drain regions and on said gate insulator layer, comprising, subsequent to formation of said source, drain and gate contacts, annealing the device in an ambient including deuterium at a partial pressure between about 2 and 6 atmospheres, at a temperature between about 350° C. and 450° C. to form a concentration of deuterium at said interface region effective to substantially reduce degradation of said device associated with hot carrier stress.

21. A process according to claim 20, wherein said annealing step comprises the final thermal processing step in manufacture of the device.

22. A process according to claim 20, wherein the annealing ambient is 100% deuterium.

23. A process for treating an insulated gate field effect transistor device including a channel region extending between source and drain regions, an insulating layer forming an interface with said channel region, contacts to said source and drain regions and on said gate insulator layer, insulating sidewall spacers adjacent to said gate contact, and an insulating barrier cap over said gate contact, comprising, subsequent to formation of said source, drain and gate contacts, of said sidewall spacers and of said insulating barrier cap, annealing the device in an ambient including deuterium at a partial pressure between about 2 and 10 atmospheres, at a temperature between about 300° C. and 600° C. for a period between from 30 minutes to about three hours, to form a concentration of deuterium at said interface region effective to substantially reduce degradation of said device associated with hot carrier stress.

24. A process according to claim 23, wherein said deuterium concentration is in the range $10^{18}$ to $10^{21}$ atoms/cc.

25. A process according to claim 6, wherein said semiconductor device is an insulated gate field effect transistor including source, drain and gate electrodes and wherein said annealing treatment is carried out subsequent to formation of said source drain and gate contacts.

26. A process according to claim 20, wherein said annealing treatment is carried out subsequent to contact formation and at least some interconnect metallization.

* * * * *